US009698212B2

(12) United States Patent
Basker et al.

(10) Patent No.: US 9,698,212 B2
(45) Date of Patent: Jul. 4, 2017

(54) THREE-DIMENSIONAL METAL RESISTOR FORMATION

(71) Applicant: International Business Machines Corporation, Armonk, NY (US)

(72) Inventors: Veeraraghavan S. Basker, Schenectady, NY (US); Kangguo Cheng, Schenectady, NY (US); Theodorus E. Standaert, Clifton Park, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/953,882

(22) Filed: Nov. 30, 2015

(65) Prior Publication Data

US 2017/0154950 A1  Jun. 1, 2017

(51) Int. Cl.
  *H01L 21/20* (2006.01)
  *H01L 49/02* (2006.01)
  *H01L 27/13* (2006.01)

(52) U.S. Cl.
  CPC .............. *H01L 28/24* (2013.01); *H01L 27/13* (2013.01)

(58) Field of Classification Search
  None
  See application file for complete search history.

(56) References Cited

U.S. PATENT DOCUMENTS

| 7,397,087 | B2 | 7/2008 | Chinthakindi et al. |
| 7,879,666 | B2 | 2/2011 | Zhang et al. |
| 7,994,576 | B2 | 8/2011 | Tseng et al. |
| 8,058,125 | B1 | 11/2011 | Lin et al. |
| 8,492,286 | B2 | 7/2013 | Utomo et al. |
| 8,680,618 | B2 | 3/2014 | Eshun |
| 8,865,542 | B2 | 10/2014 | Lim et al. |
| 9,000,564 | B2 | 4/2015 | Montanini et al. |
| 9,012,293 | B2 | 4/2015 | Xiao et al. |
| 2008/0067629 | A1 | 3/2008 | Miyashita |
| 2011/0073957 | A1* | 3/2011 | Chiu ................... H01L 27/0629 257/380 |
| 2014/0111301 | A1* | 4/2014 | Williams ............... H01L 28/24 338/308 |

* cited by examiner

*Primary Examiner* — Cory Eskridge
(74) *Attorney, Agent, or Firm* — Vazken Alexanian; Ryan, Mason & Lewis, LLP

(57) ABSTRACT

A method includes forming an insulating carrier substrate, forming a shallow trench isolation region within the insulating carrier substrate, and forming a plurality of gate recesses on the shallow trench isolation region. The plurality of gate recesses is formed by forming a plurality of dummy gates on the shallow trench isolation region and etching the plurality of dummy gates. The method further includes depositing a metal resistor layer within the plurality of gate recesses.

20 Claims, 6 Drawing Sheets

400

500

600

600

700

800

900

THREE-DIMENSIONAL METAL RESISTOR FORMATION

BACKGROUND

In semiconductor integrated circuits (IC), a metal resistor (RM resistor) may be formed as a planar metal resistor generally patterned during a middle-of-the-line (MOL) process, either above a trench silicide (TS) or above a diffusion contact (CA) layer. In such topography, subsequent patterning and etching processes may be difficult to achieve. In addition, the planar metal resistor can consume a significant amount of chip area, e.g., 100 nanometers (nm) in width and multiples of 100 nm in length.

SUMMARY

Embodiments provide techniques for forming a three-dimensional (3D) metal resistor through dummy gate cavities.

For example, in one embodiment, a method comprises forming an insulating carrier substrate, forming a shallow trench isolation region within the insulating carrier substrate, and forming a plurality of gate recesses on the shallow trench isolation region. The plurality of gate recesses is formed by forming a plurality of dummy gates on the shallow trench isolation region and etching the plurality of dummy gates. The method further comprises depositing a metal resistor layer within the plurality of gate recesses.

DETAILED DESCRIPTION

Embodiments will now be described in further detail with regard to techniques for forming a three-dimensional (3D) RM resistor through dummy gate cavities. It is to be understood that the various layers, structures, and/or regions shown in the accompanying drawings are schematic illustrations that are not necessarily drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be used to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present such as, by way of example only, 1% or less than the stated amount. Also, in the figures, the illustrated scale of one layer, structure, and/or region relative to another layer, structure, and/or region is not necessarily intended to represent actual scale.

According to embodiments of the invention, a method of forming a 3D RM resistor through dummy gate cavities reduces the complexity of subsequent patterning and etching processes while significantly reducing the consumed chip area.

Figure 1A:
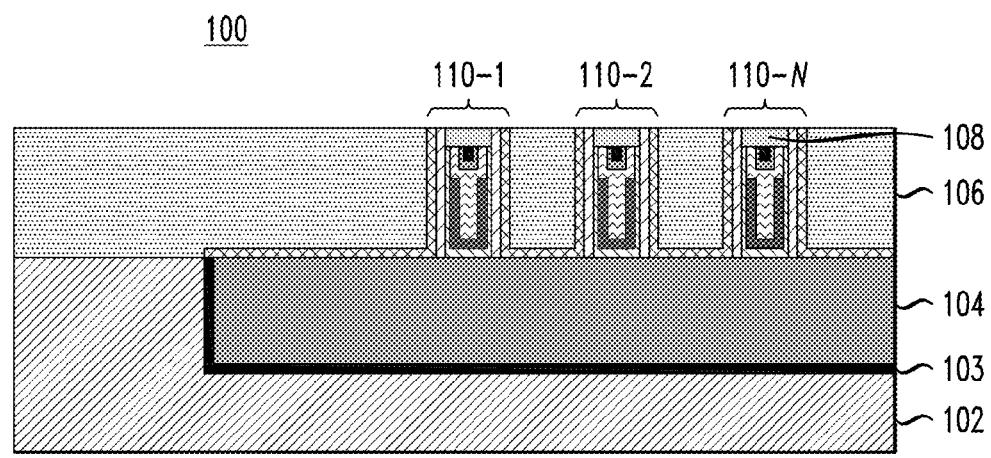
FIG. 1A is a schematic cross-sectional view of a semiconductor die having a plurality of dummy metal gates, according to an embodiment of the invention.

Referring now to FIG. 1A, a semiconductor die structure comprising a plurality of dummy gates is illustrated. For example, a structure 100 comprises a silicon substrate 102 and a shallow trench isolation (STI) region 104 formed within the surface of the silicon substrate 102. The silicon substrate 102 may comprise any semiconductor material including, for example, but not limited to, Si, SiGe, SiGeC, SiC, GaAs, silicon-on-insulators (SOIs) and layered semiconductors such as Si/SiGe or any III-V material. The structure 100 further comprises an STI liner 103 in between the silicon substrate 102 and the STI region 104 covering the walls and bottom portion of the STI region 104. The STI liner 103 may comprise, for example, Sift or SiN.

Furthermore, the structure 100 further comprises a plurality of dummy metal gates 110-1, 110-2, . . . 110-N (collectively referred to as dummy metal gates 110) formed on the surface of the STI region 104. The outermost layer for each of the dummy metal gates is a SiN layer which also covers open surfaces of the STI region 104. Each of the dummy metal gates 110 is capped with a SiN cap 108. SiN caps are generally utilized in processes using self-aligned contacts. The structure 100 further comprises an oxide layer 106 deposited over the STI region 104 and on the surface of the silicon substrate 102. The oxide layer 106 is coplanar with the top surface of the dummy metal gates 110.

Figure 1B:
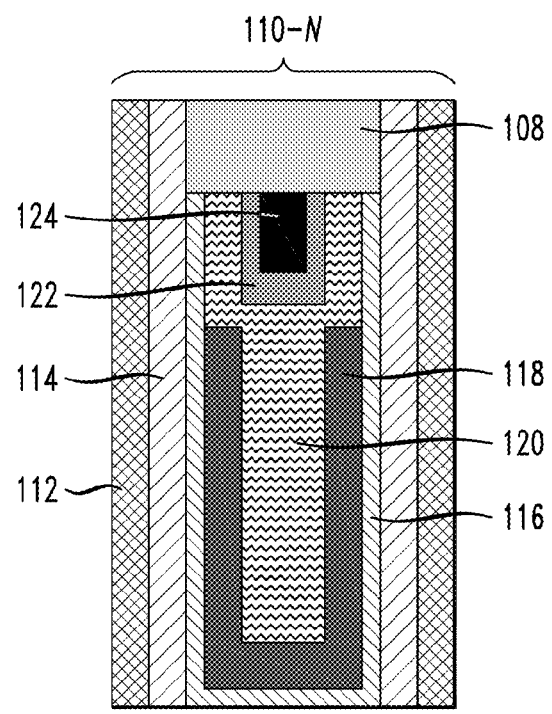
FIG. 1B is a detailed view of a possible arrangement of dummy metal gate, according to an embodiment of the invention.

Referring now to FIG. 1B, one of the plurality of dummy metal gates 110 is shown in greater detail. A dummy gate 110-N may comprise SiN sidewalls 112 formed along the vertical sides in contact with the oxide layer 106. The dummy gate 110-N may further comprise low-k spacers 114 formed along the SiN sidewalls 112. The low-k spacers 114 may comprise, for example, SiBCN or SiOCN or any other similar low-k material. The dummy gate 110-N may further comprise a high-k dielectric material 116, deposited as a liner adjacent to the low-k spacers 114 and on the bottom surface of the dummy gate 110-N just above the STI region 104. The high-k dielectric material 116 may comprise, for example, $HfO_x$. The dummy gate 110-N may further comprise a first work function metal 118 and a second work function metal 120, the work function metals utilized for nFETs and pFETs. Lastly, the dummy gate 110-N may comprise a first gate structure 122 and a second gate structure 124. The first gate structure 122 may comprise, for example, barrier metal TiN and the second gate structure 124 may comprise, for example, tungsten (W). As described above, the SiN cap 108 completes the top surface of the dummy metal gate 110-N.

Figure 2:
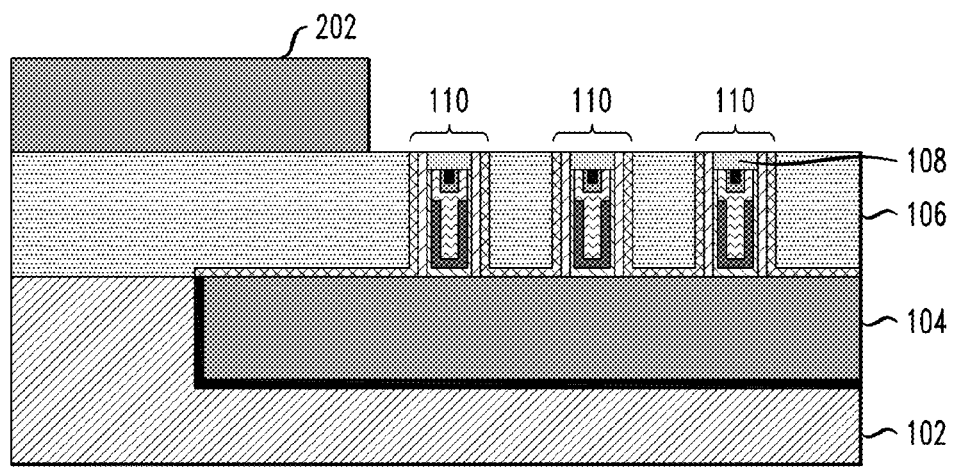
FIG. 2 is a schematic cross-sectional view of the semiconductor die of FIG. 1, after forming a mask, according to an embodiment of the invention.

Referring now to FIG. 2, a schematic cross-sectional view of the semiconductor die structure of FIG. 1A is shown, after forming a lithographic mask 202. The lithographic mask 202 exposes those areas to be used for forming a precision metal resistor RM in the dummy gates 110.

Figure 3:
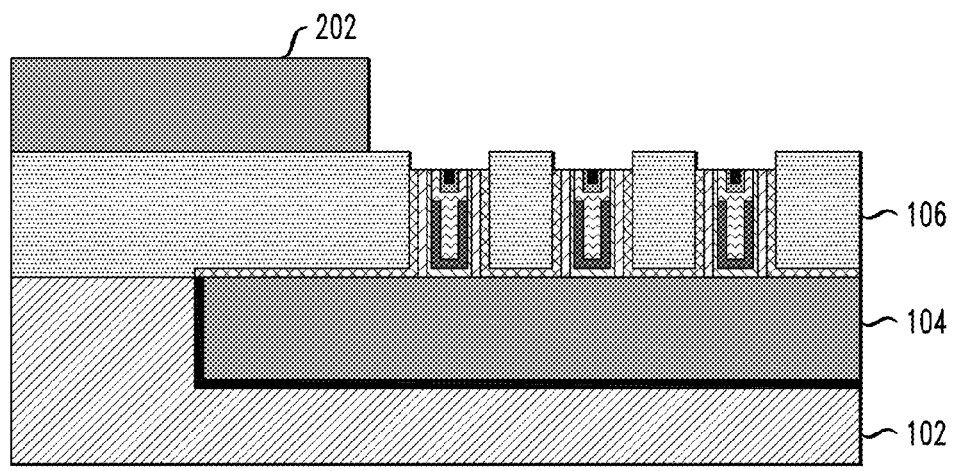
FIG. 3 is a schematic cross-sectional view of the semiconductor die of FIG. 2, after removing SiN caps, according to an embodiment of the invention.

Referring now to FIG. 3, a schematic cross-sectional view of the semiconductor die structure of FIG. 2 is shown, after a process of etching the SiN cap 108 from the dummy metal gates 110 using the lithographic mask 202. The process of etching the SiN cap 108 also removes portions of SiN sidewalls 112 and low K material spacer 114 alongside SiN cap 108. Gases such as $CF_4/H_2$, $CF_4/O_2/N_2$, $SF_6/O_2/N_2$, $SF_6/CH_4/N_2$ or $SF_6/CH_4/N_2/O_2$ are typically utilized for this etching process.

Figure 4:
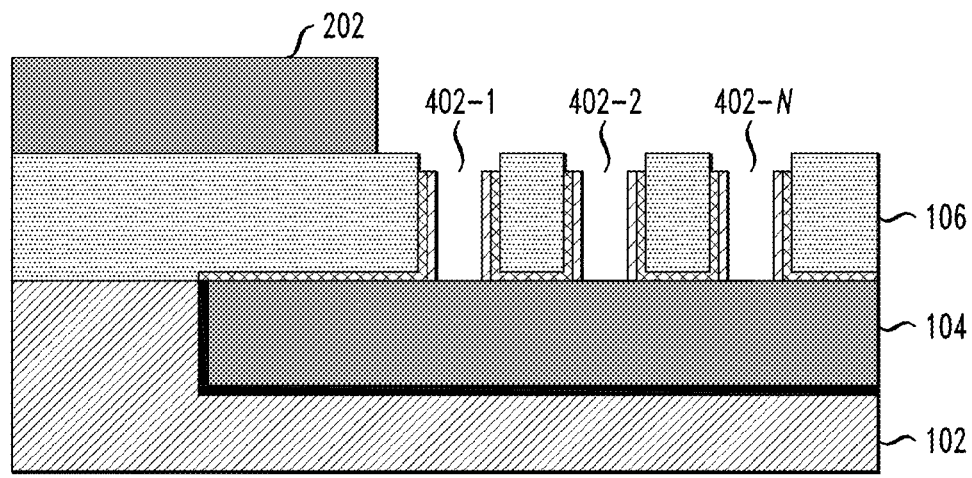
FIG. 4 is a schematic cross-sectional view of the semiconductor die of FIG. 3, after metal gate recess, according to an embodiment of the invention.

Referring now to FIG. 4, a schematic cross-sectional view of the semiconductor die structure of FIG. 3 is shown, after removing the remaining portions of the dummy metal gates 110, leaving metal gate recesses 402-1, 402-2, . . . 402-N (collectively referred to as metal gate recess 402) in each of the plurality of dummy metal gates 110. Removal of the metal portions of the dummy metal gates may comprise an etching process using, for example, fluorinated gases such as $SF_6/O_2$, $CF_4/O_2$ or $CBrF_3/O_2$. It should be noted that the etching process does not remove the SiN sidewalls 112 or low-k spacers 114.

Figure 5:
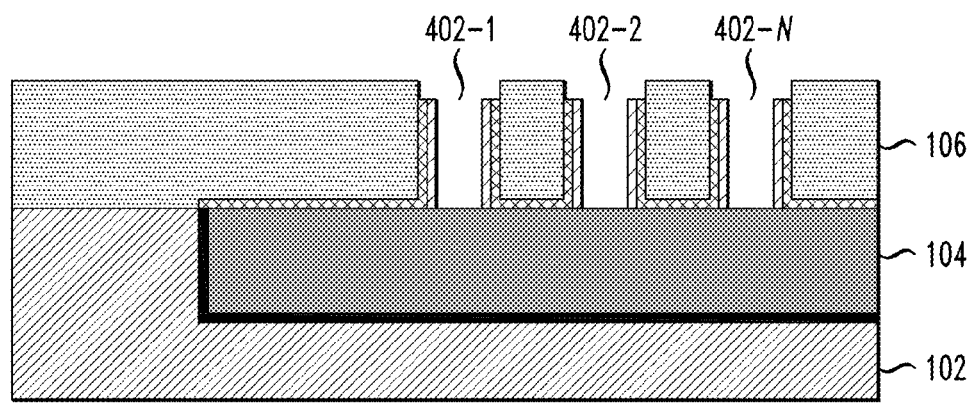
FIG. 5 is a schematic cross-sectional view of the semiconductor die of FIG. 4, after stripping the mask, according to an embodiment of the invention.

Referring now to FIG. 5, a schematic cross-sectional view of the semiconductor die structure of FIG. 4 is shown, after removing the lithographic mask 202 in preparation for deposition of the precision metal resistor RM. Lithographic mask 202, generally comprising a resist and organic planarization films, is typically removed by oxygen plasma or SPM ($H_2SO_4:H_2O_2$ solution).

Figure 6A:
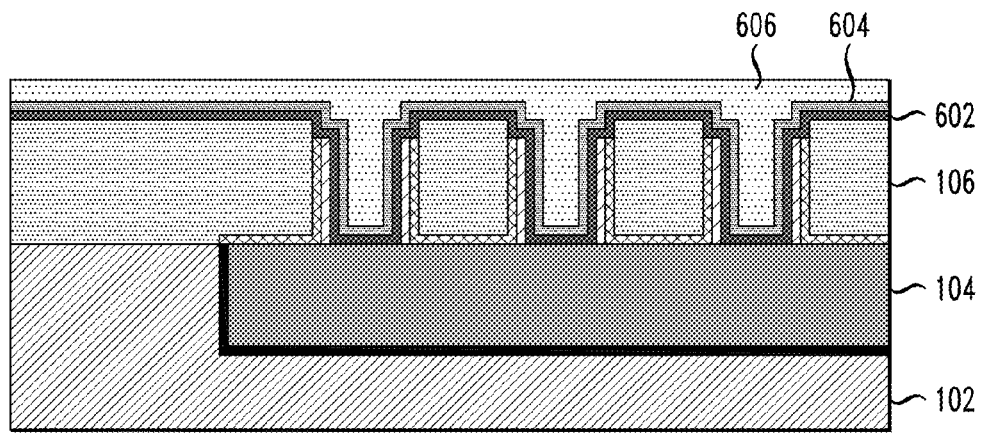
FIG. 6A is a schematic cross-sectional view of the semiconductor die of FIG. 5, after depositing the metal resistor, according to an embodiment of the invention.

Referring now to FIG. 6A, a schematic cross-sectional view of the semiconductor die structure of FIG. 5 is shown, after depositing RM. For example, the semiconductor die structure 600 shows a SiN layer 602 deposited in the metal gate recess 402 and on the surface of the oxide layer 106. Following the deposition of the SiN layer 602, resistor material is deposited onto the SiN layer 602 forming a precision metal resistor RM 604 on both the horizontal surfaces of the SiN layer 602 and the vertical sides of the SiN layer 602 within the metal gate recess 402. The precision metal resistor RM 604 may comprise composite materials such as, for example, tungsten silicon (WSi) or other materials capable of forming a precision resistance, for example but not limited to TiN, TaN, Co etc. Following the deposition of the precision metal resistor RM 604, an insulating layer 606 is deposited, forming a planar surface on the semiconductor die in preparation of further processing steps. The insulating layer 606 may comprise SiN or other appropriate oxide.

Figure 6B:
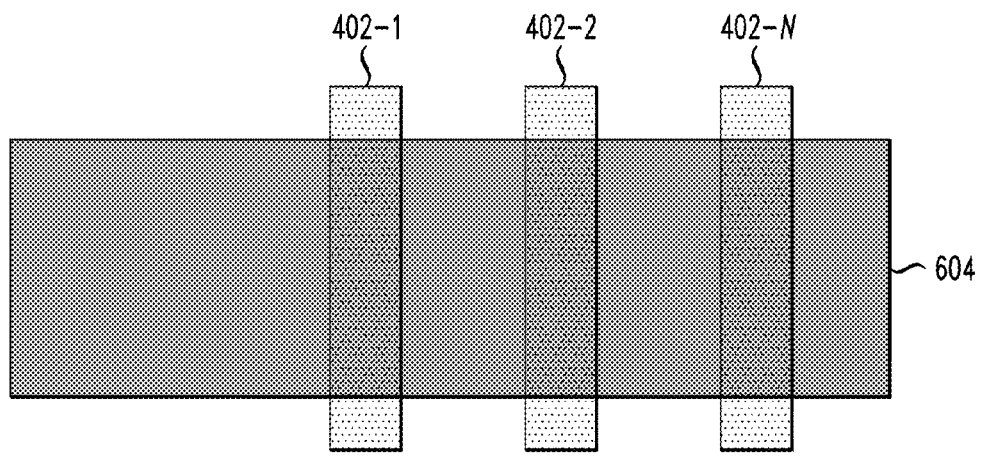
FIG. 6B is a top-down view of the semiconductor die of FIG. 6A, according to an embodiment of the invention.

FIG. 6B illustrates a simplified top down view showing the precision metal resistor RM 604 formed through the metal gate recess 402. The precision metal resistor RM 604, typically may range from 10 nm to 20 nm in thickness and from 200 nm to 300 nm in width. Moreover, a WSi precision metal resistor RM may comprise, for example, a resistance ranging from 400 to 500 ohm/square and have a tolerance of +/−10%.

Figure 7:
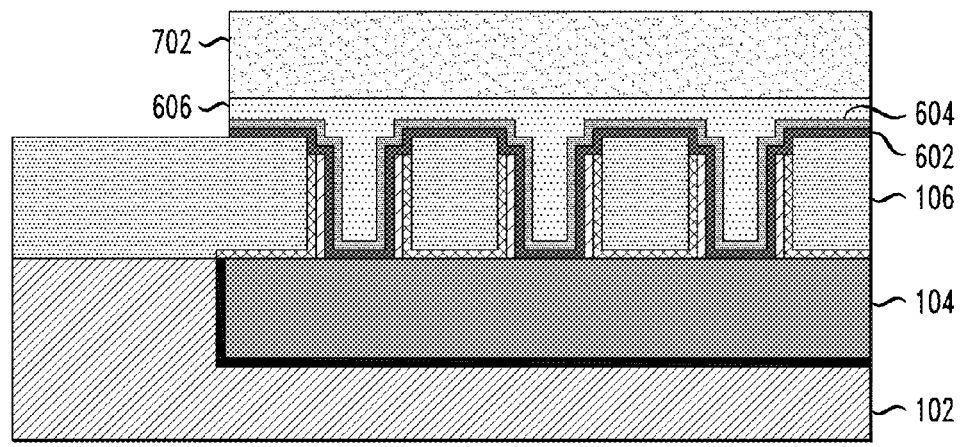
FIG. 7 is a schematic cross-sectional view of the semiconductor die of FIG. 6A, after metal resistor patterning, according to an embodiment of the invention.

Referring now to FIG. 7, a schematic cross-sectional view of the semiconductor die structure of FIG. 6A is shown, after forming a patterned mask 702 on the insulating layer 606. Thereafter, excess portions of the precision metal resistor RM 604, the SiN layer 602 and the insulating layer 606 are etched, using for example, reactive ion etching (RIE).

Figure 8:
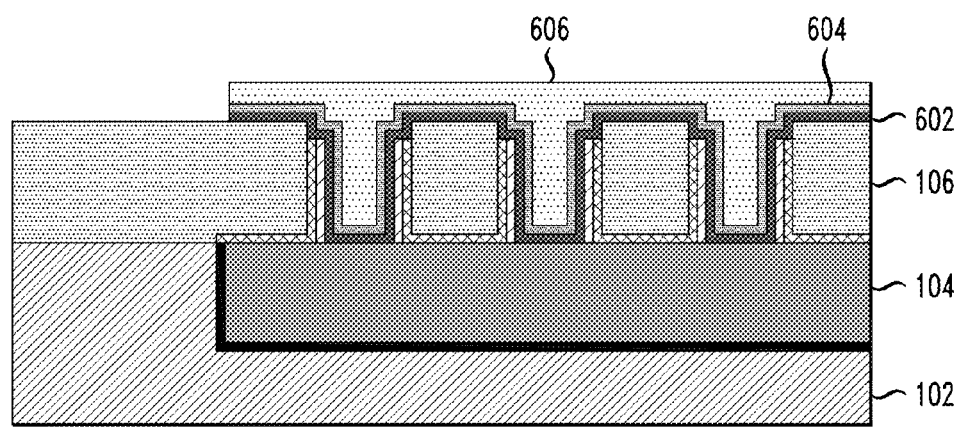
FIG. 8 is a schematic cross-sectional view of the semiconductor die of FIG. 7, after stripping the metal resistor patterning mask, according to an embodiment of the invention.

Referring now to FIG. 8, a schematic cross-sectional view of the semiconductor die structure of FIG. 7 is shown, after stripping off the patterned mask 702. The patterned mask 702, usually a resist and organic planarization films, can be removed by oxygen plasma or SPM ($H_2SO_4:H_2O_2$ solution).

Figure 9:
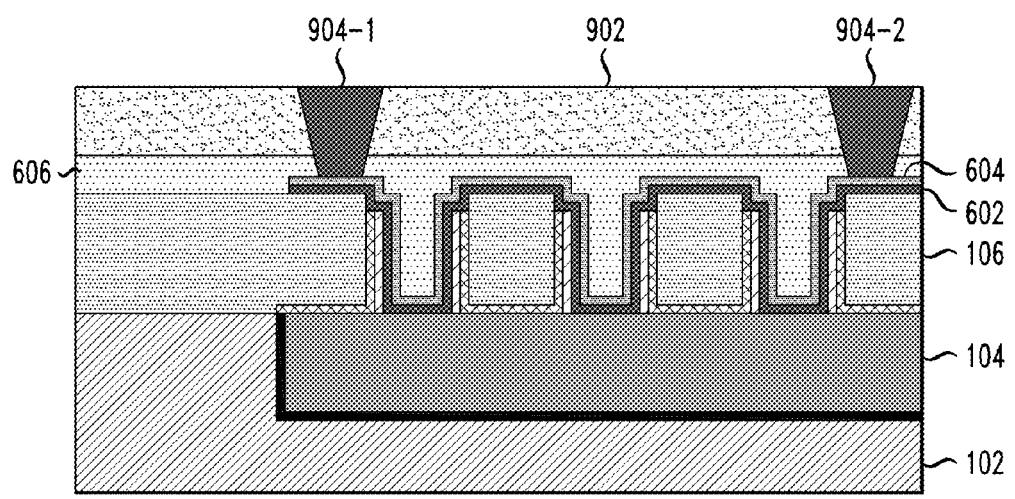
FIG. 9 is a schematic cross-sectional view of the semiconductor die of FIG. 8, after contact formation, according to an embodiment of the invention.

Referring now to FIG. 9, a schematic cross-sectional view of the semiconductor die structure of FIG. 8 is shown, after forming contact plugs that enable connection of a precision metal resistor RM to other circuit components. For example, a semiconductor die structure 900 comprises depositing additional insulating layer 606, which may comprise SiN, in those regions previously etched away in reference to FIG. 7. Then, a low-k dielectric layer 902 is deposited on the entire insulating layer 606. Finally, contacts 904-1 and 904-2 are then formed through the low-k dielectric layer 902 and the insulating layer 606 connecting the ends of the precision metal resistor RM 604 to the upper surface of the low-k dielectric layer 902 for connection to other circuit elements. The process of forming the contacts 904-1 and 904-2 may include, for example, a lithographic process to define the contact areas, RIE processing to form trenches (or vias) defined by the lithographic process, deposition of a trench liner comprising, for example, TiN or TaN, and followed by the contact metal formation. The contacts 904-1 and 904-2 may comprise conductive materials such as W, Ru, Co, Cu, etc.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing embodiments of the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A method comprising:
forming an insulating carrier substrate;
forming a shallow trench isolation region within the insulating carrier substrate;
forming a plurality of dummy metal gates on the shallow trench isolation region;
forming a plurality of gate recesses on the shallow trench isolation region by etching the plurality of dummy metal gates to expose a surface of the shallow trench isolation region; and
depositing a metal resistor layer within the plurality of gate recesses.

2. The method of claim 1, further comprising forming a lithographic mask prior to depositing the metal resistor layer to expose areas to be used for forming the metal resistor layer.

3. The method of claim 1, wherein at least one dummy metal gate further comprises a SiN cap.

4. The method of claim 1, wherein the metal resistor layer comprises at least one of tungsten silicide (WSi), titanium nitride (TiN), tantalum nitride (TaN), and cobalt (Co).

5. The method of claim 1, wherein the metal resistor layer comprises a thickness ranging from about 10 nanometers to about 20 nanometers.

6. The method of claim 1, wherein the metal resistor layer comprises a width ranging from about 200 nanometers to about 300 nanometers.

7. The method of claim 1, wherein metal resistor layer comprises a resistance ranging from about 400 ohms per square to about 500 ohms per square.

8. The method of claim 1, further comprising depositing a patterned mask wherein the pattern mask exposes excess areas of the metal resistor layer to be etched.

9. The method of claim 1, further comprising forming one or more contact plugs on the metal resistor layer.

10. An apparatus comprising:
an insulating carrier substrate;
a shallow trench isolation region formed within the insulating carrier substrate;
spacer material formed on the shallow trench isolation region;
a plurality of gate recesses formed on the shallow trench isolation region, wherein each gates recess of the plurality of gate recesses is bounded by the spacer material;
a silicon mononitride (SiN) layer deposited within the plurality of gate recesses; and
a metal resistor layer deposited on the SiN layer.

11. The apparatus of claim 10, wherein the metal resistor layer comprises at least one of tungsten silicide (WSi), titanium nitride (TiN), tantalum nitride (TaN), and cobalt (Co).

12. The apparatus claim 10, wherein the metal resistor layer comprises a thickness ranging from about 10 nanometers to about 20 nanometers.

13. The apparatus of claim 10, wherein the metal resistor layer comprises a width ranging from about 200 nanometers to about 300 nanometers.

14. The apparatus of claim 10, wherein metal resistor layer comprises a resistance ranging from about 400 ohms per square to about 500 ohms per square.

15. An integrated circuit comprising:
an insulating carrier substrate;
a shallow trench isolation region formed within the insulating carrier substrate;
spacer material formed on the shallow trench isolation region;
a plurality of gate recesses formed on the shallow trench isolation region, wherein each gates recess of the plurality of gate recesses is bounded by the spacer material;
a silicon mononitride (SiN) layer deposited within the plurality of gate recesses; and
a metal resistor layer deposited on the SiN layer.

16. The apparatus of claim 10, further comprising an insulating layer deposited on the metal resistor layer.

17. The apparatus of claim 16, further comprising a dielectric layer deposited on the insulating layer, and one or more contact plugs formed on the metal resistor layer, wherein the one or more contact plugs are formed through the dielectric layer and the insulating layer.

18. The integrated circuit of claim 15, further comprising an insulating layer deposited on the metal resistor layer.

19. The integrated circuit of claim 18, further comprising a dielectric layer deposited on the insulating layer, and one or more contact plugs formed on the metal resistor layer, wherein the one or more contact plugs are formed through the dielectric layer and the insulating layer.

20. The method of claim 9, further comprising depositing an insulating layer on the metal resistor layer, and depositing a dielectric layer on the insulating layer, wherein the one or more contact plugs are formed through the dielectric layer and the insulating layer.

* * * * *